(12) United States Patent
Murphy et al.

(10) Patent No.: US 10,174,248 B2
(45) Date of Patent: Jan. 8, 2019

(54) PROCESS FOR IMPROVED HALIDE MATERIALS

(71) Applicant: General Electric Company, Schenectady, NY (US)

(72) Inventors: James Edward Murphy, Niskayuna, NY (US); Anant Achyut Setlur, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/566,061

(22) PCT Filed: May 18, 2015

(86) PCT No.: PCT/US2015/031302
§ 371 (c)(1),
(2) Date: Oct. 12, 2017

(87) PCT Pub. No.: WO2016/186637
PCT Pub. Date: Nov. 24, 2016

(65) Prior Publication Data
US 2018/0134956 A1  May 17, 2018

(51) Int. Cl.
*H01L 33/00* (2010.01)
*C09K 11/77* (2006.01)
*H01L 33/50* (2010.01)

(52) U.S. Cl.
CPC ........ *C09K 11/779* (2013.01); *C09K 11/7733* (2013.01); *C09K 11/7773* (2013.01); *H01L 33/502* (2013.01)

(58) Field of Classification Search
None
See application file for complete search history.

(56) References Cited

U.S. PATENT DOCUMENTS

| 3,843,556 | A | 10/1974 | Panson et al. |
| 4,900,584 | A | 2/1990 | Tuenge et al. |
| 6,048,468 | A | 4/2000 | Isoda |
| 7,368,093 | B2 | 5/2008 | Ikada et al. |
| 8,252,613 | B1 | 8/2012 | Lyons et al. |
| 8,703,016 | B2 | 4/2014 | Nammalwar et al. |
| 2004/0156986 | A1* | 8/2004 | Yadav .................... B82Y 30/00 427/180 |
| 2004/0266095 | A1* | 12/2004 | Oh .................... H01L 27/11502 438/240 |
| 2012/0305972 | A1 | 12/2012 | Meyer et al. |
| 2013/0264937 | A1 | 10/2013 | Sakuta et al. |
| 2014/0268655 | A1 | 9/2014 | Murphy et al. |
| 2014/0327026 | A1 | 11/2014 | Murphy et al. |

FOREIGN PATENT DOCUMENTS

| EP | 0506585 A1 | 9/1992 |
| WO | 2013078460 A1 | 5/2013 |
| WO | 2014104143 A1 | 7/2014 |

OTHER PUBLICATIONS

INternational Search Report and Written Opinion issued in connection with corresponding patent application PCT/US2015/031302 dated Jan. 14, 2016.

Lepoutre et al.,"Structural investigations of sol-gel-derived LiYF4 and LiGdF4 powders", Journal of Solid State Chemistry, ScienceDirect, vol. 180, Issue 11 , pp. 3049-3057, Nov. 2007.

* cited by examiner

*Primary Examiner* — Calvin Y Choi

(57) ABSTRACT

A process for treating a luminescent halogen-containing material includes contacting the luminescent halogen-containing material with an atmosphere comprising a halogen-containing oxidizing agent for a period of at least about two hours. The luminescent halogen-containing material has a composition other than (i) $A_x[MF_y]:Mn^{4+}$, where A is Li, Na, K, Rb, Cs, or a combination thereof; M is Si, Ge, Sn, Ti, Zr, Al, Ga, In, Sc, Y, La, Nb, Ta, Bi, Gd, or a combination thereof; x is the absolute value of the charge of the $[MF_y]$ ion; and y is 5, 6 or 7;

(ii) $Zn_2[MF_7]:Mn^{4+}$, where M is selected from Al, Ga, In, and combinations thereof;

(iii) $E[MF_6]:Mn^{4+}$, where E is selected from Mg, Ca, Sr, Ba, Zn, and combinations thereof; and where M is selected from Ge, Si, Sn, Ti, Zr, and combinations thereof; or (iv) $Ba_{0.65}Zr_{0.35}F_{2.70}:Mn^{4+}$.

17 Claims, No Drawings

PROCESS FOR IMPROVED HALIDE MATERIALS

BACKGROUND

Phosphors and other light emitting inorganic materials containing halide atoms are susceptible to degradation by high temperature, high humidity conditions. Degraded materials may have reduced efficacy. Therefore, improvement in stability of these materials is desirable.

BRIEF DESCRIPTION

Briefly, in one aspect, the present invention relates to a process for treating a luminescent halogen-containing material. The process includes contacting the luminescent halogen-containing material with an atmosphere comprising a halogen-containing oxidizing agent for a period of at least about two hours. The luminescent halogen-containing material has a composition other than:
- (i) $A_x[MF_y]:Mn^{4+}$, where A is Li, Na, K, Rb, Cs, or a combination thereof; M is Si, Ge, Sn, Ti, Zr, Al, Ga, In, Sc, Y, La, Nb, Ta, Bi, Gd, or a combination thereof; x is the absolute value of the charge of the $[MF_y]$ ion; and y is 5, 6 or 7;
- (ii) $Zn_2[MF_7]:Mn^{4+}$, where M is selected from Al, Ga, In, and combinations thereof;
- (iii) $E[MF_6]:Mn^{4+}$, where E is selected from Mg, Ca, Sr, Ba, Zn, and combinations thereof; and where M is selected from Ge, Si, Sn, Ti, Zr, and combinations thereof; or
- (iv) $Ba_{0.65}Zr_{0.35}F_{2.70}:Mn^{4+}$

DETAILED DESCRIPTION

The luminescent halogen-containing materials produced by the processes according to the present invention have photoluminescent, including fluorescent and phosphorescent, radioluminescent, thermoluminescent, or electroluminescent properties. In the context of the present invention, the luminescent halogen-containing materials are materials having optoelectric properties. In many embodiments, the materials are phosphors.

The luminescent halogen-containing material may contain a dopant atom such as $Ce^{3+}$, $Eu^{2+}$, $Eu^{3+}$, $Mn^{2+}$, $Sn^{2+}$, OTHER $Sb^{3+}$, $Bi^{3+}$, or $Ti^{4+}$, or may be undoped. In many embodiments, the dopant is an ion in a high oxidation state, for example, $Eu^{3+}$, $Sb^{3+}$, $Bi^{3+}$, or $Ti^{4+}$.

The luminescent halogen-containing materials include luminescent doped halosilicates, luminescent doped halophosphates, luminescent doped halides, luminescent doped oxyhalides, luminescent doped haloborates, luminescent doped halogermanates, luminescent undoped halides, and luminescent undoped halophosphates. Examples of luminescent halosilicates include, but are not limited to, $LaSiO_3Cl:Ce^{3+}$; $LaSiO_3Cl:Ce^{3+}$, $Tb^{3+}$; $Ca_3SiO_4Cl_2:Pb^{2+}$; $Ca_3SiO_4Cl_2:Eu^{2+}$; $Ba_5SiO_4Cl_6:Eu^{2+}$; $Ba_5SiO_4Br_6:Eu^{2+}$; $Mg_3SiO_3F_4:Ti^{4+}$; $Sr_5Si_4O_{10}Cl_6:Eu^{2+}$; and $Na(Mg_{2-x}Mn_x)LiSi_4O_{10}F_2:Mn$; where $0 \leq x \leq 100$. Examples of luminescent undoped halophosphates include $Ca_5(PO_4)_3F:Mn^{2+}$; $Ca_5(PO_4)_3F:Sb^{2+}$; $Ca_5(PO_4)_3F:Sn^{2+}$; $Ca_5(PO_4)_3Cl:Eu^{2+}$; $Ca_5(PO_4)_3Cl:Mn^{2+}$; $Ca_5(PO_4)_3Cl:Sb^{2+}$; $Ca_5(PO_4)_3Cl:Sn^{2+}$; $Ca_5(PO_4)_3(F;Cl):Sb$; Mn; $(Ba;Ca;Mg)_5(PO_4)_3Cl:Eu^{2+}$; $Cd_5(PO_4)_3Cl:Mn^{2+}$; $Sr_5(PO_4)_3Cl:Eu^{2+}$; $Sr_5(PO_4)_3Cl:Mn^{2+}$; $Sr_5(PO_4)_3Cl:Sb^{2+}$; $Sr_5(PO_4)_3Cl:Sn^{2+}$; $Sr_5(PO_4)_3Cl:Eu^{2+}$; $Pr^{3+}$; $Ba_5(PO_4)_3Cl:Eu^{2+}$; $Ba_5(PO_4)_3Cl:U$; $Ca_2Ba_3(PO_4)_3Cl:Eu^{2+}$; $3Cd_3(PO_4)_2 \cdot CdCl_2:Mn^{2+}$; $3Ca_3(PO_4)_2$; $Ca(F;Cl)_2:Sb^{3+}$; $Mn^{2+}$; $3Sr_3(PO_4)_2 \cdot SrF_2:Sn^{2+}$; $Mn^{2+}$; and $3Sr_3(PO_4)_2 \cdot CaCl_2:Eu^{2+}$. Examples of luminescent doped halide compounds include $MgF_2:Mn^{2+}$; $CaF_2:Ce^{3+}$; $CaF_2:Eu^{2+}$; $CaF_2:Mn^{2+}$; $CaF_2:Ce^{3+}$; $Eu^{2+}$; $CaF_2:Ce^{3+}$, $Tb^{3+}$; $CaF_2:U$; $CaCl_2:Eu^{2+}$ in $SiO_2$; $CaCl_2:Eu^{2+}$; $Mn^{2+}$ in $SiO_2$; $BaCl_2:Eu^{2+}$ in $SiO_2$; $CaI_2:Eu^{2+}$ in $SiO_2$; $CaI_2:Eu^{2+}$; $Mn^{2+}$ in $SiO_2$; $SrF_2:Eu^{2+}$; $SrBr:Eu^{2+}$; $SrCl_2:Eu^{2+}$ in $SiO_2$; $Sr(Cl; Br; I)_2:Eu^{2+}$ in $SiO_2$; $CsI:Na^+$; $CsI:Tl$; $CsBr:Eu^{2+}$; $KCl:Eu^{2+}$; $RbBr:Tl$; $RbBr:Tl^+$; $RbI:Tl^+$; $ZnF_2:Mn^{2+}$; $(Zn; Mg)F_2:Mn^{2+}$; $(Ba;Sr)F_2:Eu^{2+}$; $BaFBr:Eu^{2+}$; $BaBr_2:Eu^{2+}$; $BaFCl:Eu^{2+}$; $BaFCl:Eu^{2+}$; $Pb^{2+}$; $BaFI:Eu^{2+}$; $Ba_2Mg_3F_{10}:Eu^{2+}$; $BaMg_3F_8:Eu^{2+}$; $Mn^{2+}$; $BaY_2F_8:Er^{3+}$, $Yb^{3+}$; $LaBr_3:Ce^{3+}$; $LaCl_3:Ce^{3+}$; $YF_3:Mn^{2+}$; $YF_3:Mn^{2+}$, $Th^{4+}$; $YF_3:Er^{3+}$, $Yb^{3+}$; $YF_3:Em^{3+}$, $Yb^{3+}$; $NaYF_4:Er^{3+}$, $Yb^{3+}$; $KMgF_3:Eu^{2+}$; $KMgF_3:Mn^{2+}$; $3.5MgO \cdot 0.5MgF_2 \cdot GeO_2:Mn^{4+}$; and $LiAlF_4:Mn^{2+}$. Examples of luminescent doped oxyhalide compounds include $YOBr:Eu^{2+}$; $YOCl:Eu^{2+}$; $YOCl:Ce^{3+}$; $YOF:Eu^{2+}$; $YOF:Tb^{3+}$; $LaOF:Eu^{3+}$; $LaOCl:Bi^{3+}$; $LaOCl:Eu^{3+}$; and $LaOBr:Bi^{3+}$, $Tb^{3+}$, $Pr^{3+}$. Examples of luminescent doped borate compounds include $Ca_2B_5O_9Br:Eu^{2+}$; $Ca_2B_5O_9Cl:Eu^{2+}$; $Ca_2B_5O_9Cl:Pb^{2+}$; and $SrFB_2O_{3.5}:Eu^{2+}$. Examples of luminescent doped germinate compounds include $Mg_4(F)GeO_6:Mn^{2+}$; $Mg_4(F)(Ge; Sn)O_6:Mn^{2+}$; and $Mg_8Ge_2O_{11}:Mn^{4+}$. Examples of luminescent undoped halide compounds include $BaF_2$; $BaY_2F_8$; $CaF_2$, $MgF_2$; $SrF_2$; $KMgF_3$; $RbCaF_3$; $LiYF_4$ (YLF); Nd:YLF; $LiBaAlF_6$; $LiCaAlF_6$; $LiSrAlF_6$; $CeF_3$; $CsF$; $LaBr_3$; $LaCl_3$; $RbBr$; $KI$; $CsI$; $KCl$; $CuCl:NaCl$; and $(ErCl_3)_{0.25}(BaCl_2)_{0.75}$. Examples of luminescent undoped phosphate compounds include $Ca_5(PO_4)_3F$; $Ca_5(PO_4)_3Cl$; and $Sr_5(PO_4)_3Cl$.

In some embodiments, the luminescent halogen-containing material contains fluorine. Luminescent fluorine-containing materials for use in the processes of the present invention include luminescent doped fluorosilicates, luminescent doped fluorophosphates, luminescent doped fluorides, luminescent doped oxyfluorides, luminescent doped fluoroborates, luminescent doped fluorogermanates, luminescent undoped fluorides, and fluorophosphates. Examples of luminescent fluorosilicates include $Mg_3SiO_3F_4:Ti^{4+}$ and $Na(Mg_{2-x}Mn_x)LiSi_4O_{10}F_2:Mn$, where $0 \leq x \leq 100$. Examples of luminescent fluorophosphates include $Ca_5(PO_4)_3F:Mn^{2+}$; $Ca_5(PO_4)_3F:Sb^{2+}$; $Ca_5(PO_4)_3F:Sn^{2+}$; $Ca_5(PO_4)_3(F;Cl):Sb$; Mn; $3Ca_3(PO_4)_2 \cdot Ca(F; Cl)_2:Sb^{3+}$; $Mn^{2+}$; and $3Sr_3(PO_4)_2 \cdot SrF_2:Sn^{2+}$; $Mn^{2+}$. Examples of luminescent doped fluoride compounds include $MgF_2:Mn^{2+}$; $CaF_2:Ce^{3+}$; $CaF_2:Eu^{2+}$; $CaF_2:Mn^{2+}$; $CaF_2:Ce^{3+}$; $Eu^{2+}$; $CaF_2:Ce^{3+}$, $Tb^{3+}$; $CaF_2:U$; $SrF_2:Eu^{2+}$; $SrBr:Eu^{2+}$; $ZnF_2:Mn^{2+}$; $(Zn; Mg)F_2:Mn^{2+}$; $(Ba;Sr)F_2:Eu^{2+}$; $BaFBr:Eu^{2+}$; $BaBr_2:Eu^{2+}$; $BaFCl:Eu^{2+}$; $BaFCl:Eu^{2+}$, $Pb^{2+}$; $BaFI:Eu^{2+}$; $Ba_2Mg_3F_{10}:Eu^{2+}$; $BaMg_3F_8:Eu^{2+}$, $Mn^{2+}$; $BaY_2F_8:Er^{3+}$, $Yb^{3+}$; $YF_3:Mn^{2+}$; $YF_3:Mn^{2+}$, $Th^{4+}$; $YF_3:Er^{3+}$, $Yb^{3+}$; $YF_3:Em^{3+}$, $Yb^{3+}$; $NaYF_4:Er^{3+}$, $Yb^{3+}$, $KMgF_3:Eu^{2+}$, $KMgF_3:Mn^{2+}$, $3.5MgO \cdot 0.5MgF_2 \cdot GeO_2:Mn^{4+}$, and $LiAlF_4:Mn^{2+}$. Examples of luminescent oxyfluoride compounds include $YOF:Eu^{2+}$, $YOF:Tb^{3+}$, and $LaOF:Eu^{3+}$. An example of a fluoroborate is $SrFB_2O_{3.5}:Eu^{2+}$, and examples of luminescent fluorogermanates are $Mg_4(F)GeO_6:Mn^{2+}$ and $Mg_4(F)(Ge, Sn)O_6:Mn^{2+}$. Examples of luminescent undoped fluoride compounds include $BaF_2BaY_2F_8$; $CaF_2$, $MgF_2$; $SrF_2$; $KMgF_3$; $RbCaF_3$; $LiYF_4$ (YLF); Nd:YLF; $LiBaAlF_6$, $LiCaAlF_6$, $LiSrAlF_6$; $CeF_3$; and $CsF$. An example of an undoped fluorophosphate is $Ca_5(PO_4)_3F$.

The temperature at which the luminescent halogen-containing material is contacted with the halogen-containing oxidizing agent may range from about 200° C. to about 700° C., particularly from about 350° C. to about 550° C. during contact. In various embodiments of the present invention, the temperature is at least 100° C., in others, at least 350° C., and still others at least 550° C. Melting point of the material may be used as a guide for selecting the annealing temperature for some materials, although for some materials having very high melting points, annealing at or near the melting point of the material under an atmosphere containing a significant amount of a halogen-containing oxidizing agent, particularly fluorine gas, may compromise the reaction vessel and lead to unsafe operating conditions. Accordingly, for materials having a melting point less than 1400° C., in some embodiments, the temperature is at least 50% of the melting point of the material, in others at least 65% of the melting point of the material, and in still others, at least 80% of the melting point of the material.

The luminescent halogen-containing material is contacted with the oxidizing agent for a period of time sufficient to develop the desired properties in the product. Time and temperature are interrelated, and may be adjusted together, for example, increasing time while reducing temperature, or increasing temperature while reducing time. In particular embodiments, the time is at least two hours, particularly for at least four hours, more particularly at least six hours, and most particularly at least eight hours. In an exemplary embodiment, a luminescent halogen-containing material that is stable under annealing conditions may be contacted with the oxidizing agent for a period of about twelve hours at a temperature of about 540° C. Other luminescent halogen-containing materials that are less stable may be contacted with the oxidizing agent for a briefer period and/or lower temperature, for example, four hours at a temperature of about 300° C.

The halogen-containing oxidizing agent may be a halogen gas such as fluorine gas, chlorine gas, bromine gas, or iodine gas, or a combination. In some embodiments, halogen-containing oxidizing agent is a fluorine-containing oxidizing agent, particularly $F_2$, HF, $BrF_5$, $NH_4HF_2$, $NH_4F$, KF, $AlF_3$, $SbF_5$, $ClF_3$, $BrF_3SbF_6$, KrF, $XeF_2$, $XeF_4$, $SiF_4$, $NF_3$ or a combination thereof. In particular embodiments, the halogen-containing oxidizing agent is $F_2$. The amount of oxidizing agent in the atmosphere may be varied to obtain a product having the desired properties, particularly in conjunction with variation of time and temperature. Where the halogen-containing oxidizing agent is $F_2$, the atmosphere may include at least 0.5% $F_2$, although a lower concentration may be effective in some embodiments. In particular the atmosphere may include at least 5% $F_2$, more particularly, at least 20% $F_2$, and even more particularly, at least 35% $F_2$. The atmosphere may additionally include nitrogen, helium, neon, argon, krypton, xenon, in any combination with fluorine gas.

For undoped materials and doped materials having a dopant ion in a higher oxidation state, conditions resulting in a greater degree of oxidation may be used. Examples of doped materials having dopant ions in a higher oxidation state include materials containing $Eu^{3+}$, $Sb^{3+}$, $Bi^{3+}$, or $Ti^{4+}$ as a dopant, including, but not limited to, $YOBr:Eu^{3+}$, $YOCl:Eu^{3+}$, $YOF:Eu^{3+}$, $LaOF:Eu^3$, $LaOCl:Eu^{3+}$, $LaOCl:Bi^{3+}$; $LaOBr:Bi^{3+}$, $Ca(F;Cl)_2:Sb^{3+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$, and $Mg_3SiO_3F_4:Ti^{4+}$. Conditions resulting in a greater degree of oxidation include higher temperatures, higher amounts of oxidizing agent in the atmosphere, and longer times. For example, a material such as $YOBr:Eu^{3+}$, $YOCl:Eu^{3+}$, or $YOF:Eu^{3+}$ may be treated with an atmosphere containing 40% fluorine for 12 hours at a temperature of about 540° C. Materials containing a dopant ion in a lower oxidation state, such as $Eu^{2+}$, may require more gentle conditions, that is, conditions resulting in a lesser degree of oxidation. In one non-limiting example, a material such as $(Ba;Ca;Mg)_5(PO_4)_3Cl:Eu^{2+}$; $Sr_5(PO_4)_3Cl:Eu^{2+}$; or $Ba_5(PO_4)_3Cl:Eu^{2+}$, may be treated with an atmosphere containing 0.2% fluorine for 4 hours at a temperature of about 300° C. For all materials, temperature, time, and composition of the atmosphere may be varied independently to achieve a desired effect.

Although the inventors do not wish to be held to any particular theory to explain the improvement in color stability that can result from subjecting the luminescent halogen-containing material to a process according to the present invention, it is postulated that the material may contain defects such as dislocations, F– vacancies, cation vacancies, manganese species such as $Mn^{2+}$ and $Mn^{3+}$ ions, or H+/OH– groups that provide non-radiative recombination pathways, and these are healed or removed by exposure to the oxidizing agent at elevated temperature.

The manner of contacting the precursor with the halogen-containing oxidizing agent is not critical and may be accomplished in any way sufficient to convert the material to a color stable phosphor having the desired properties. In some embodiments, the chamber containing the material may be dosed and then sealed such that an overpressure develops as the chamber is heated, and in others, components of the atmosphere is flowed throughout the anneal process ensuring a more uniform pressure. In some embodiments, an additional dose of the oxidizing agent may be introduced after a period of time.

The luminescent halogen-containing materials may be useful in a diverse range of applications. For example, phosphors may be used for lighting applications in lamps such as LED lamps, fluorescent lamps, high pressure mercury lamps, and other high intensity discharge lamps, and as quantum splitting phosphors. The materials may also be used for displays, including plasma display panels and cathode ray tube phosphor screens, including radar, low speed displays, and light pens. The materials may also be used in radiographic imaging applications, including scintillators for digital x-ray detectors, gamma ray detectors, and x-ray intensifying screens for x-ray film. The materials may also be used in thermoluminescent dosimeters, as long persistent phosphors for use in safety indicators, displays, and other applications, and as solid state laser sources.

The luminescent halogen-containing material may be optically coupled to a radiation source such as a semiconductor LED. Optically coupled means that the elements are associated with each other so radiation from one is transmitted to the other. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In some embodiments, the luminescent halogen-containing material may be combined with one or more other light emitting materials such as phosphors. By combination with other materials in an apparatus with a LED, the desired color of the resultant light emitted by the assembly may be achieved. Phosphors such as green, blue, orange, or other color phosphors may be used in the blend to customize the color of the resulting light.

Example 1

A sample of YOF:Eu$^{3+}$ is placed in a furnace chamber. The furnace chamber is evacuated using a mechanical pump and purged multiple times with nitrogen and nitrogen, fluorine mixtures. After several pump and purge cycles, the furnace chamber is filled with an atmosphere containing 40% fluorine gas and 60% nitrogen gas to a pressure of about one atmosphere. The chamber is then heated to about 540° C. After holding for about twelve hours, the chamber is cooled to room temperature. The fluorine nitrogen mixture is evacuated, the chamber is filled and purged several times with nitrogen to ensure the complete removal of fluorine gas before opening the chamber.

Example 2

A sample of CaF$_2$:Eu$^{2+}$ is placed in a furnace chamber. The furnace chamber is evacuated using a mechanical pump and purged multiple times with nitrogen and nitrogen, fluorine mixtures. After several pump and purge cycles, the furnace chamber is filled with an atmosphere containing 0.2% fluorine gas and 98.8% nitrogen gas to a pressure of about one atmosphere. The chamber is then heated to about 300° C. After holding for about four hours, the chamber is cooled to room temperature. The fluorine nitrogen mixture is evacuated, the chamber is filled and purged several times with nitrogen to ensure the complete removal of fluorine gas before opening the chamber.

The invention claimed is:

1. A process for treating a luminescent halogen-containing material, the process comprising
   contacting the luminescent halogen-containing material with an atmosphere comprising a halogen-containing oxidizing agent for a period of at least about two hours; with the proviso that the luminescent halogen-containing material comprises a composition other than:
   (i) Ax [MFy]:Mn4+, where A is Li, Na, K, Rb, Cs, or a combination thereof; M is Si, Ge, Sn, Ti, Zr, Al, Ga, In, Sc, Y, La, Nb, Ta, Bi, Gd, or a combination thereof; x is the absolute value of the charge of the [MFy] ion; and y is 5, 6 or 7;
   (ii) Zn2[MF7]:Mn4+, where M is selected from Al, Ga, In, and combinations thereof;
   (iii) E[MF6]:Mn4+, where E is selected from Mg, Ca, Sr, Ba, Zn, and combinations thereof; and where M is selected from Ge, Si, Sn, Ti, Zr, and combinations thereof; or
   (iv) Ba0.65Zr0.35F2.70:Mn4+.

2. A process according to claim 1, wherein the luminescent halogen-containing material is selected from selected from the group consisting of doped halosilicates, doped halophosphates, doped halides, doped oxyhalides, doped haloborates, doped halogermanates, undoped halides, undoped halophosphates, and combinations thereof.

3. A process according to claim 1, wherein the luminescent halogen-containing material is selected from LaSiO3Cl:Ce3+; LaSiO3Cl:Ce3+, Tb3+; Ca3 SiO4Cl2:Pb2+; Ca3SiO4Cl2:Eu2+; Ba5SiO4Cl6:Eu2+; Ba5SiO4Br6:Eu2+; Mg3SiO3F4:Ti4+; Sr5Si4O10Cl6:Eu2+; Na(Mg2-x, Mnx)LiSi4O10F2:Mn; where 0≤x≤100; Ca5(PO4)3F:Mn2+; Ca5(PO4)3F:Sb2+; Ca5(PO4)3F:Sn2+; Ca5(PO4)3Cl:Eu2+; Ca5(PO4)3Cl:Mn2+; Ca5(PO4)3Cl:Sb2+; Ca5(PO4)3Cl:Sn2+; Ca5(PO4)3(F;Cl):Sb; Mn; (Ba;Ca;Mg)5(PO4)3Cl:Eu2+; Cd5(PO4)3Cl:Mn2+; Sr5(PO4)3Cl:Eu2+; Sr5(PO4)3Cl:Mn2+; Sr5(PO4)3Cl:Sb2+; Sr5(PO4)3Cl:Sn2+; Srs(PO4)3Cl:Eu2+; Pr3+; Ba5(PO4)3Cl:Eu2+; Ba5(PO4)3Cl:U; Ca2Ba3(PO4)3Cl:Eu2+; 3Cd3(PO4)2.CdCl2:Mn2+; 3Ca3(PO4)2.Ca(F;Cl)2:Sb3+; Mn2+; 3Sr3(PO4)2.SrF2:Sn2+; Mn2+; 3Sr3(PO4)2.CaCl2:Eu2+; MgF2:Mn2+; CaF2:Ce3+; CaF2:Eu2+; CaF2:Mn2+; CaF2:Ce3+; Eu2+; CaF2:Ce3+, Tb3+; CaF2:U; CaCl2:Eu2+ in SiO2; CaCl2:Eu2+; Mn2+ in SiO2; BaCl2:Eu2+ in SiO2; CaI2:Eu2+ in SiO2; CaI2:Eu2+; Mn2+ in SiO2; SrF2:Eu2+; SrFBr:Eu2+; SrCl2:Eu2+ in SiO2; Sr(Cl; Br; I)2:Eu2+ in SiO2; CsI:Na+; CsI:T1; CsBr:Eu2+; KCl:Eu2+; RbBr:T1; RbBr:T1+; RbI:T1+; ZnF2:Mn2+; (Zn; Mg)F2:Mn2+; (Ba; Sr)F2:Eu2+; BaFBr:Eu2+; BaBr2:Eu2+; BaFCl:Eu2+; BaFCl:Eu2+; Pb2+; BaFI:Eu2+; Ba2Mg3F10:Eu2+; BaMg3F8:Eu2+; Mn2+; BaY2F8:Er3+, Yb3+; LaBr3:Ce3+; LaCl3:Ce3+; YF3:Mn2+; YF3:Mn2+, Th4+; YF3:Er3+, Yb3+; YF3:Em3+, Yb3+; NaYF4:Er3+, Yb3+; KMgF3:Eu2+; KMgF3:Mn2+; 3.5MgO.0.5MgF2.GeO2:Mn4+; LiAlF4:Mn2+; YOBr:Eu2+; YOCl:Eu2+; YOCl:Ce3+; YOF:Eu2+; YOF:Tb3+; LaOF:Eu3+; LaOCl:Bi3+; LaOCl:Eu3+; LaOBr:Bi3+, Tb3+; Pr3+; Ca2B5O9Br:Eu2+; Ca2B5O9Cl:Eu2+; Ca2B5O9Cl:Pb2+; SrFB2O3.5:Eu2+; Mg4(F)GeO6:Mn2+; Mg4(F)(Ge; Sn)O6:Mn2+; Mg8Ge2O11:Mn4+; BaF2; BaY2F8; CaF2; MgF2; SrF2; KMgF3; RbCaF3; LiYF4 (YLF); Nd:YLF; LiBaAlF6; LiCaAlF6; LiSrAlF6; CeF3; CsF; LaBr3; LaCl3; RbBr; KI; CsI; KCl; CuCl:NaCl; (ErCl3)0.25(BaCl2)0.75; Ca5(PO4)3F; Ca5(PO4)3Cl; Sr5(PO4)3Cl; and combinations thereof.

4. A process according to claim 1, wherein the atmosphere comprises a fluorine-containing oxidizing agent selected from F2, anhydrous HF, BrF5, NH4HF2, NH4F, AlF3, SbF5, ClF3, BrF3 SbF6, KrF, XeF2, XeF4, NF3 or a combination thereof.

5. A process according to claim 1, wherein the luminescent halogen-containing material is Mg3SiO3F4:Ti4+; Na(Mg2-x, Mnx)LiSi4O10F2:Mn, where 0≤x≤100; Ca5(PO4)3F:Mn2+; Ca5(PO4)3F:Sb2+; Ca5(PO4)3F:Sn2+; Ca5(PO4)3(F;Cl):Sb; Mn; 3Ca3(PO4)2.Ca(F;Cl)2:Sb3+; Mn2+; 3Sr3(PO4)2.SrF2:Sn2+; Mn2+; MgF2:Mn2+; CaF2:Ce3+; CaF2:Eu2+; CaF2:Mn2+; CaF2:Ce3+;Eu2+; CaF2:Ce3+, Tb3+; CaF2:U; SrF2:Eu2+; SrFBr:Eu2+; ZnF2:Mn2+; (Zn; Mg)F2:Mn2+; (Ba;Sr)F2:Eu2+; BaFBr:Eu2+; BaBr2:Eu2+; BaFCl:Eu2+; BaFCl:Eu2+, Pb2+, BaFI:Eu2+; Ba2Mg3F10:Eu2+; BaMg3F8:Eu2+, Mn2+, BaY2F8:Er3+, Yb3+; YF3:Mn2+; YF3:Mn2+, Th4+; YF3:Er3+, Yb3+; YF3:Em3+, Yb3+; NaYF4:Er3+, Yb3+; KMgF3:Eu2+; KMgF3:Mn2+, 3.5MgO.0.5MgF2 GeO2:Mn4+; LiAlF4:Mn2+; YOF:Eu2+, YOF:Tb3+, LaOF:Eu3+; SrFB2O3.5:Eu2+, Mg4(F)GeO6:Mn2+; Mg4(F)(Ge, Sn)O6:Mn2+; BaF2BaY2F8; CaF2; MgF2; SrF2; KMgF3; RbCaF3; LiYF4 (YLF); Nd:YLF; LiBaAlF6; LiCaAlF6; LiSrAlF6; CeF3; CsF; Ca5(PO4)3F, and combinations thereof.

6. A process according to claim 1, wherein the luminescent halogen-containing material comprises a dopant.

7. A process according to claim 1, wherein the luminescent halogen-containing material comprises Eu3+.

8. A process according to claim 1, wherein the luminescent halogen-containing material is YOBr:Eu3+, YOCl:Eu3+, YOF:Eu3+, LaOF:Eu3, LaOCl:Eu3+, or a combination thereof.

9. A process according to claim 1, additionally comprising annealing the phosphor at a temperature of at least about 250° C. while contacting the phosphor with the atmosphere comprising fluorine gas.

10. A process according to claim 9, wherein the elevated temperature is any temperature in a range from about 500° C. to about 600° C.

11. A process according to claim 1, wherein the halogen-containing oxidizing agent comprises a halogen gas selected from fluorine, chlorine, bromine, iodine, or a combination thereof.

12. A process according to claim 1, wherein the halogen-containing oxidizing agent comprises fluorine gas.

13. A process according to claim 1, wherein the atmosphere additionally comprises nitrogen, helium, neon, argon, krypton, xenon, or a combination thereof.

14. A luminescent halogen-containing material produced by a process according to claim 1.

15. An apparatus comprising a semiconductor light source optically coupled to a luminescent halogen-containing material produced by a process according to claim 1.

16. An apparatus according to claim 15, comprising a backlight device.

17. A process according to claim 1, wherein the luminescent halogen-containing material comprises fluorine.

* * * * *